United States Patent
Kuang et al.

(10) Patent No.: US 6,177,708 B1
(45) Date of Patent: Jan. 23, 2001

(54) SOI FET BODY CONTACT STRUCTURE

(75) Inventors: Jente B. Kuang, Lakeville, MN (US); John P. Pennings, Walden, NY (US); George E. Smith, III, Wappingers Falls, NY (US); Michael H. Wood, Hopewell Junction, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/324,324

(22) Filed: Jun. 2, 1999

Related U.S. Application Data

(63) Continuation of application No. 09/130,357, filed on Aug. 7, 1998, which is a continuation of application No. 09/130,356, filed on Aug. 7, 1998.

(51) Int. Cl.⁷ .................................................. H01L 29/41
(52) U.S. Cl. ........................ 257/347; 257/365; 257/288; 438/151; 438/237
(58) Field of Search ................................ 438/149, 151, 438/197, 237, 279, 286; 257/213, 288, 347, 365

(56) References Cited

U.S. PATENT DOCUMENTS

| | | |
|---|---|---|
| 3,992,637 | 11/1976 | Cassidy et al. . |
| 4,899,202 * | 2/1990 | Blake et al. . |
| 5,079,605 * | 1/1992 | Blake . |
| 5,405,795 | 4/1995 | Beyer et al. . |
| 5,424,225 * | 6/1995 | Yamaguchi et al. . |
| 5,526,314 | 6/1996 | Kumar . |
| 5,573,961 * | 11/1996 | Hsu et al. . |
| 5,627,484 | 5/1997 | Tuminaro et al. . |
| 5,789,781 * | 8/1998 | McKitterick . |
| 5,811,855 * | 9/1998 | Tyson et al. . |
| 5,862,089 | 1/1999 | Raad et al. . |
| 5,897,351 * | 4/1999 | Forbes . |

FOREIGN PATENT DOCUMENTS 0 225 821 A2 * 6/1987 (JP) .

OTHER PUBLICATIONS

"SOI Technology: IBM's Next Advance in Chip Design" from the noted IBM website.

Kuehne et al., "SOI MOSFET with Buried Body Strap by Wafer Bonding", May 1998, IEEE Transactions on Electron Devices, vol. 45, No. 5, pp. 1084–1091.*

Lee et al., "A New SOI Structure for Mixed Mode IC's and Its Body–Related Characteristics", Oct. 1998, Proceedings 1998 IEEE International SOI Conference, pp. 63–64.*

* cited by examiner

*Primary Examiner*—Charles Bowers
*Assistant Examiner*—Evan Pert
(74) *Attorney, Agent, or Firm*—Lynn L. Augspurger; Venable

(57) ABSTRACT

A self-aligned SOI FET device with an "L" shaped gate structure allows an integral diode junction to be formed between the source and the body of the device. Two devices with this gate geometry can be advantageously placed side-by-side in a single rx opening that could accommodate but a single device with a "T" shaped gate structure. The devices in accordance with the teachings of this invention can be easily formed using standard prior art SOI processing steps. An aspect of this invention includes the use of these novel SOI devices with their body and source connected together in circuit applications, such as memory cell sense amplifiers, where high speed operation commends the use of SOI technology, but physical space considerations have limited their application.

12 Claims, 5 Drawing Sheets

SOI FET BODY CONTACT STRUCTURE

RELATED APPLICATIONS

Related U.S. patent applications are: Ser. No. 09/130,357 filed Aug. 7, 1998 and Ser. No. 09/130,356 filed Aug. 7, 1998 which are incorporated herein by reference, and which are assigned to the assignee of this invention.

FIELD OF THE INVENTION

This invention relates to a Silicon On Insulator (SOI) Field Effect Transistor (FET) with a body contact, and more particularly to a FET with a source-to-body contact and a gate geometry that reduces the area required for the transistor.

Trademarks: S/390 and IBM are registered trademarks of International Business Machines Corporation, Armonk, N.Y., U.S.A. and Lutus is a registered trademark of its subsidiary Lotus Development Corporation, an independent subsidiary of International Business Machines Corporation, Armonk, N.Y. Other names may be registered trademarks or product names of International Business Machines Corporation or other companies.

GLOSSARY

BC refers to an SOI transistor of the body contact type.
PC denotes the shape of poly-silicon structures in an SOI device.
rx denotes an opening in the field oxide, exposing active silicon.
Delta-W is the difference in finished manufactured dimension of a device pattern from the dimension drawn in the design.

BACKGROUND

FIG. 1 is a plan view illustrating a standard SOI self aligned FET where source S and drain D are formed in an epitaxial layer of silicon formed on the silicon oxide insulating layer. An epitaxial silicon body region underlying the gate G separates the source and drain. As will be appreciated by those skilled in the art, semiconductor devices fabricated with SOI technology have a number of operational characteristics that make them a desirable alternative to devices fabricated with bulk silicon technologies. However, if the body of an SOI transistor device floats (i.e. is not connected to a potential source), the device IV characteristics and threshold voltage may vary with the switching history the device experiences in actual operation. A cure for the floating body problems in SOI transistors is the formation of a contact to the body of the device to allow the body to be connected to a potential source so that the body no longer floats. While provision of a body contact is straightforward in principle, it is not straightforward in practice. The prior art has made a number of proposals for providing a connection to the body of an SOI device.

A prior art SOI transistor with a body contact region labeled "B" is illustrated in FIG. 2. The body contact region is doped with the same polarity as the body of the transistor (and the opposite polarity of the Source and Drain). Prior art "T" shaped devices such as that shown in FIG. 2, while generally satisfactory, have the disadvantage that more than one device cannot share the same rx bed with another "T" device. U.S. Pat. No. 5,405,795, assigned to the assignee of this application, discloses an SOI transistor with a self aligned body contact formed through an extension to the gate.

FIG. 3 is a schematic drawing of an exemplary prior art sense amplifier; i.e., a sense amplifier circuit for a SRAM. The two lines labeled RDBC and RDBT will be pulled apart by the cell during a read operation.

As will be appreciated by those skilled in the art, the differential output generated by the cell on RDBT and RDBC are coupled to the drains of the transistors. When the differential voltage between RDBT and RDBC reaches a threshold value (e.g. about ten percent of the output value), one of transistors (depending on the relative polarity of RDBT and RDBC) turns rapidly on and the other turns rapidly off. The outputs of the amplifier are taken from the drains. As will be appreciated by those skilled in the art, the speed of silicon-on-insulator FETs makes them a potentially attractive technology with which to implement such differential amplifiers. However, if the body potential changes, the threshold voltage can change.

When the signal is received, the amplifier turns on, pulling the RDBC and RDBT lines apart.

The amount of signal required for reliable operation depends on the tolerance which must be allowed for changes in the threshold voltage difference on the parallel connected transistor pairs. Any threshold voltage difference between one pair and the other requires an additional signal on the input lines to guarantee that the lines will be pulled apart in the correct direction.

When such exemplary, critical transistors are built in an SOI technology, the body voltages of the critical transistors will depend on the history of the data read from the cells. As the history is not under the control of the designer, the amplifier must be designed so that it will work with any data pattern. If multiple identical data values are read, a body voltage difference between the transistor pairs will build up over time. This will cause a threshold voltage difference between them which must be compensated for in the design. In the prior art, compensation is provided by increasing the bit line differential before the sense amplifier is turned on. The additional signal requires more time to reach the threshold level, thus reducing the performance of the SRAM. Prior art body contact approaches have not been altogether satisfactory for this application. Another example of a prior art sense amplifier to which the teachings of this invention are applicable is disclosed in U.S. Pat. No. 5,627,484, assigned to the assignee of this application and incorporated herein by reference.

SUMMARY OF THE INVENTION

An object of this invention is the provision of an improved SOI semiconductor device with a source-to-body contact which does not require added steps in the manufacturing process, does not require excessive space, and which allows two devices to be formed through the same rx bed.

Another object of the invention is the provision of sense amplifier implemented in SOI technology with the critical transistor pair comprised of SOI devices with a source-to-body contact.

Briefly, this invention contemplates the provision of a self-aligned SOI FET device with an "L" shaped gate structure that allows an integral diode junction to be formed between the source and the body of the device. Two devices with this gate geometry can be advantageously placed side-by-side in a single rx opening that could accommodate but a single device with a "T" shaped gate structure. The devices in accordance with the teachings of this invention can be easily formed using standard prior art SOI processing steps. An aspect of this invention includes the use of these novel SOI devices with their body and source connected together in circuit applications, such as memory cell sense amplifiers, where high speed operation commends the use of. SOI technology, but physical space considerations have limited their application.

DESCRIPTION OF THE DRAWINGS

The foregoing and other objects, aspects and advantages will be better understood from the following detailed description of a preferred embodiment of the invention, in which.

DETAILED DESCRIPTION OF THE INVENTION

Figure 4:
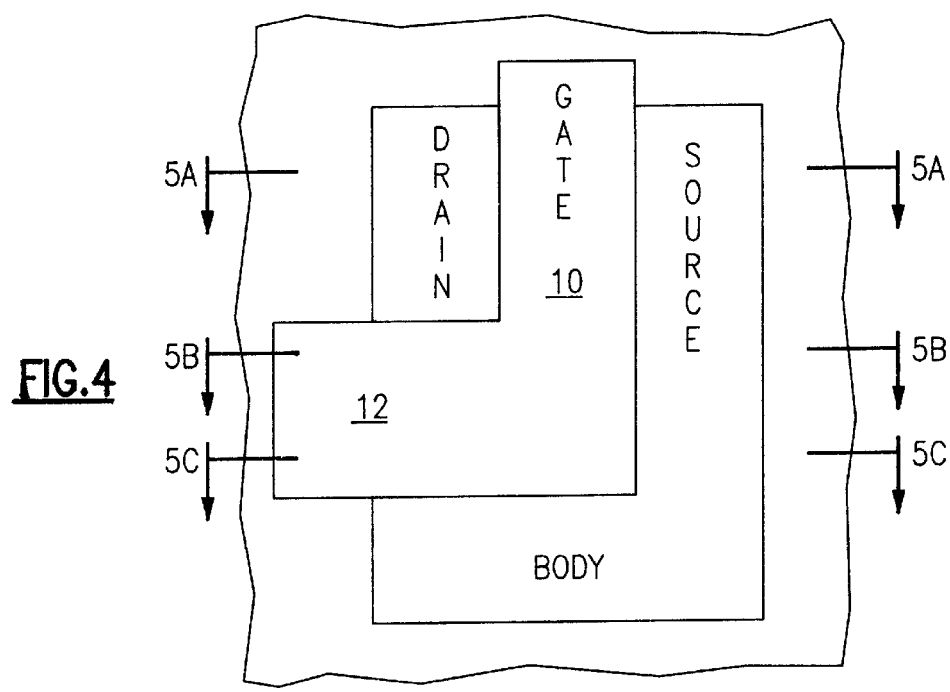
FIG. 4 is a plan view of an SOI FET with an "L" shaped gate structure in accordance with the teachings of this invention.
Figure 5A:
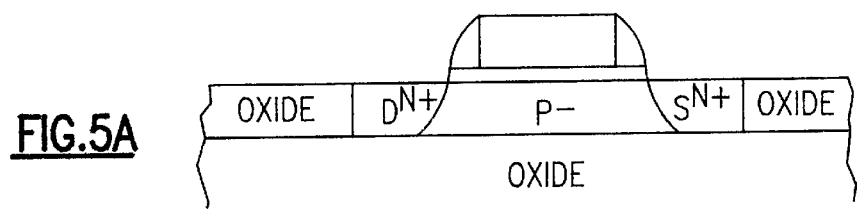
FIGS. 5A, 5B, and 5C are sectional views along the lines 5A—5A, 5B—5B, and 5C—5C respectively in FIG. 4.
Figure 5B:
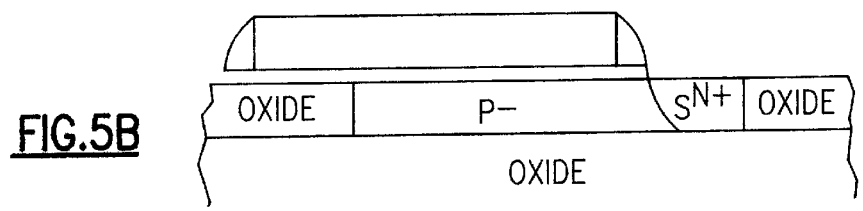
Figure 5C:
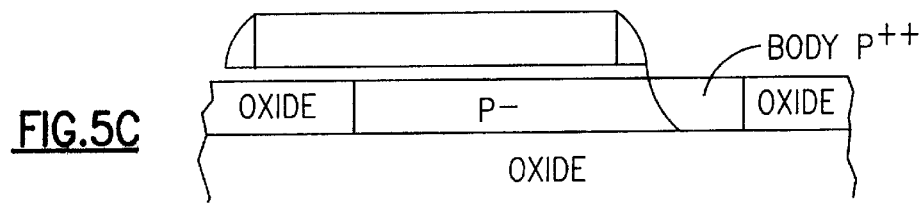

Referring now to FIGS. 4 and 5, in accordance with the teaching of this invention, an SOI, FET device is formed with an "L" shaped structure labeled GATE comprised of a section 10 running along the width of the device and functioning as a typical gate, and a section 12 which maintains a uniform body doping adjacent the drain (e.g. P$^-$ in an n-channel device and N$^-$ in a p-channel device) FIGS. 5A, 5B, and 5C show sectional views taken along the lines 5A—5A, 5B—5B, and 5C—5C respectively, illustrating the implant for a n-channel device. Here the drain D and source S are depicted with an N$^+$ implant and the body region under the gate structure 10 is P$^-$, as is conventional for a n-channel device. The body region outside gate structure 10 is doped to P$^{++}$, so that the diode junction between the source and body conducts any charge that tends to build in the body of the device. It will be appreciated that similar doping levels, but reversed polarities, would be used for a p-channel device.

Figure 6:
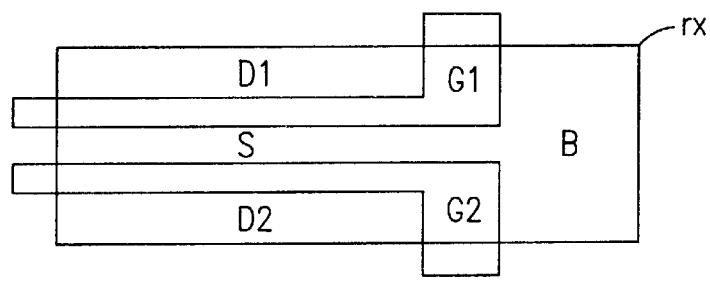
FIG. 6 is a plan view of a back-to-back pair of "L" shaped devices in accordance with the teachings of this invention.

Here it will be appreciated that this SOI device with an "L" shaped gate allows devices with a source to body connection to be placed more closely together as compared with the prior art "T" shaped gate. As shown in FIG. 6, with the "L" shaped gate, two SOI devices can be placed in the same rx bed with a common source S connected to the body B in the manner explained in connection with FIGS. 4 and 5. The relatively long, relatively narrow leg of each gate structure is disposed so that they are parallel to one another and the relatively short, relatively wide leg of each gate structure is orientated in opposite directions with respect to one another.

Figure 7:
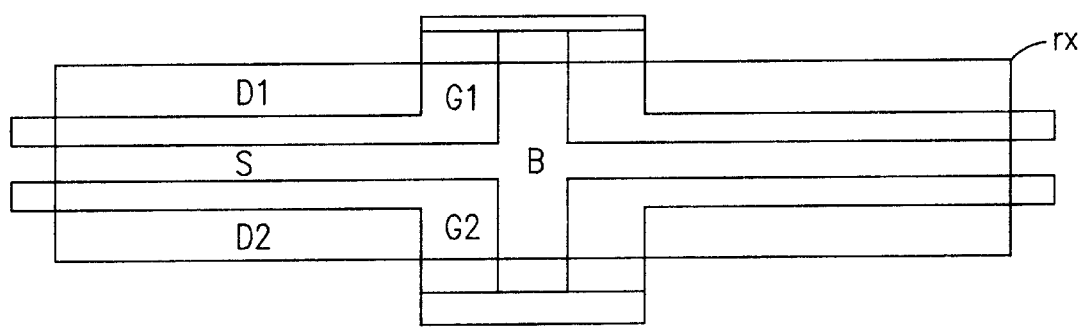
FIG. 7 is a pictorial plan view of a mirror image pair of the devices shown in FIG. 6.

It will be appreciated further that the "L" shaped gate of this invention has a problem of variations in device width due to possible PC and rx misalignment in the device manufacturing process; the same problem that is addressed in the aforementioned copending applications. A solution to this problem is to form a mirror image of the "L" shaped gate device, as is also explained in the copending applications with respect to devices with a "T" shaped gate structure. The device pair of FIG. 6 is shown in FIG. 7 with its mirror counterparts.

Figure 1:
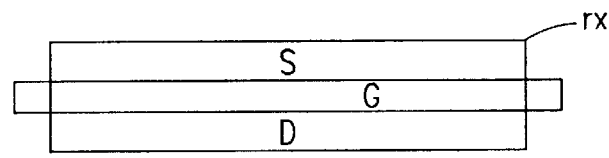
FIG. 1 is a plan view of a prior art SOI FET without a body contact.
Figure 2:
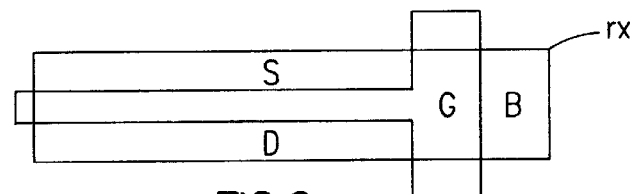
FIG. 2 is a plan view of a prior art SOI FET with a "T" shaped gate structure, providing a body contact.
Figure 3:
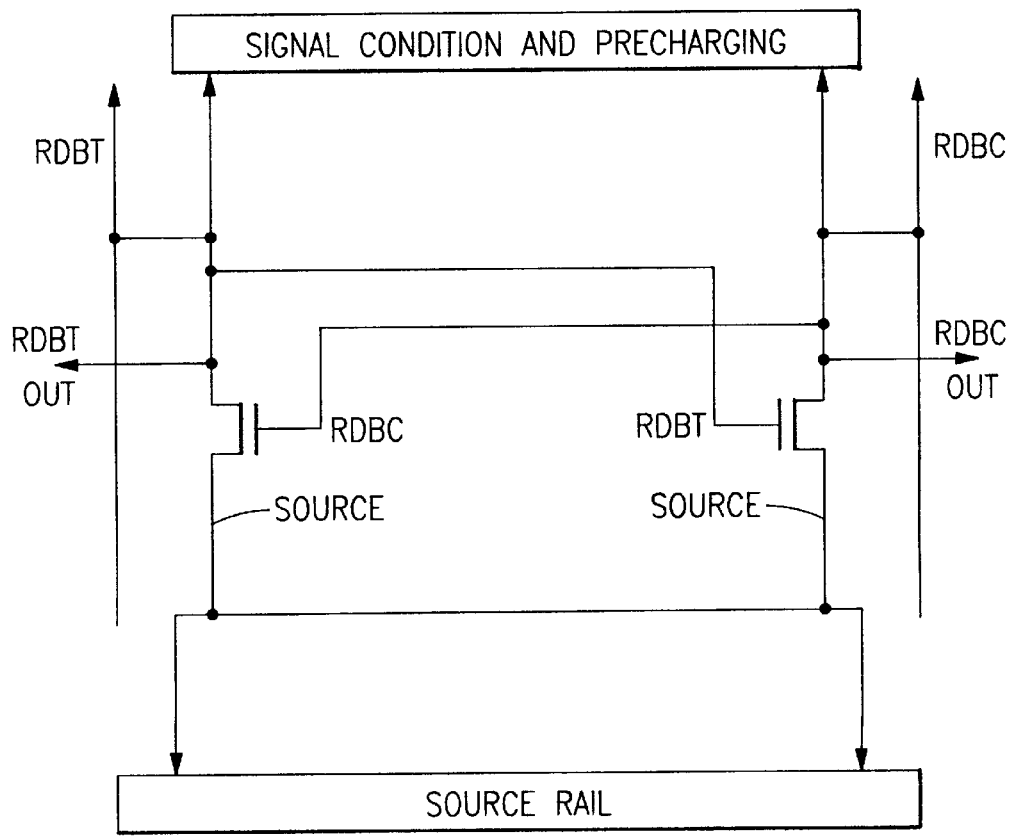
FIG. 3 is a schematic drawing of a prior art sense amplifier for reading data from a memory cell
Figure 8:
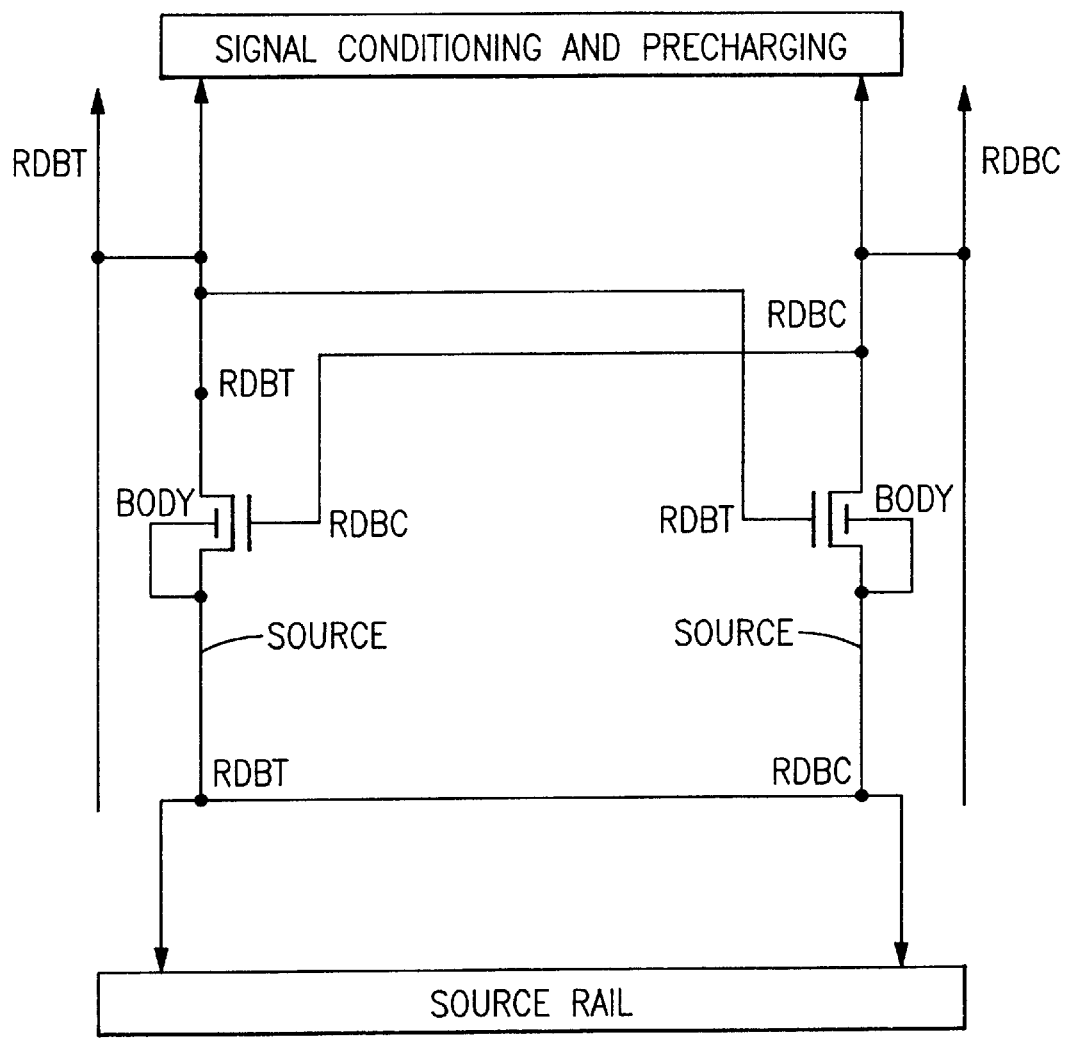
FIG. 8 is a schematic drawing of a sense amplifier of the type shown in FIG. 3 implemented in SOI with a source to drain body contact.
Figure 9:
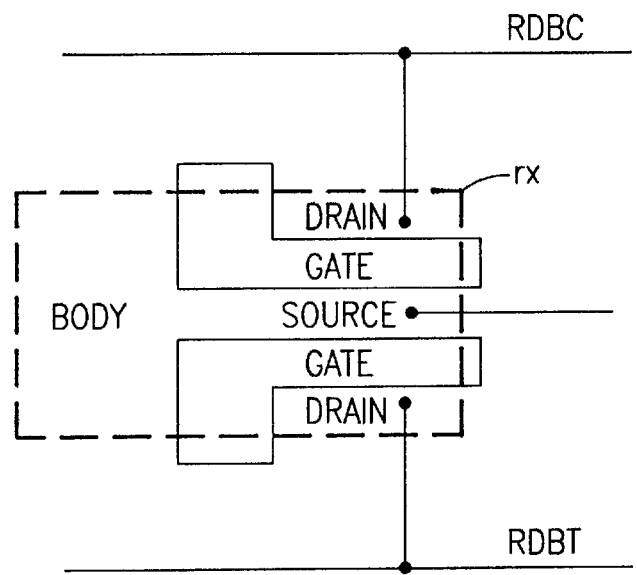
FIG. 9 is a pictorial plan view of a pair of SOI FET devices of the type shown in FIG. 6 implementing the sense amplifier shown in FIG. 8.
Figure 10:
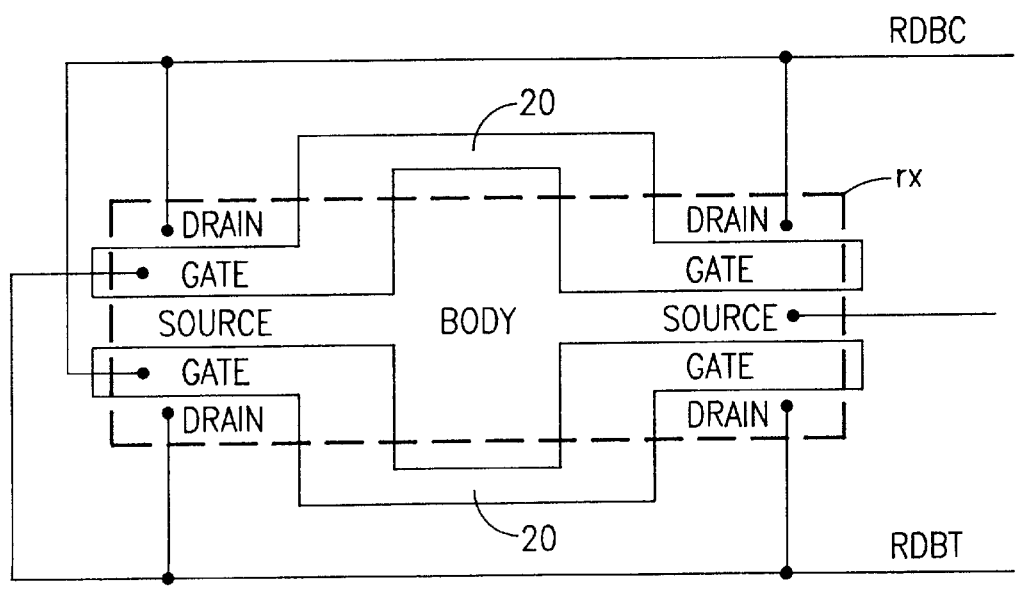
FIG. 10 is a pictorial plan view of a pair of mirror image SOI FET devices of the type shown in FIG. 7 implementing the sense amplifier shown in FIG. 8.

Referring now to FIG. 8, it shows schematically the differential sense amplifier of FIG. 3 implemented in SOI with a body to source connection to prevent a build up of body potential. FIG. 9 shows pictorially the differential sense amplifier shown in FIG. 8 implemented in SOI in accordance with the teachings of this invention. In this exemplary embodiment, two FET transistors formed through a common rx opening with a common source and an integral source to body connection; i.e. an external structure of the type shown in FIG. 6 with an internal structure shown in FIGS. 4 and 5. One leg of each "L" shaped gate structure is disposed on either side of a common source. One differential input, RDBT, is coupled to the drain of the transistor shown upper most in FIG. 9, and the other differential input, RDBD, is coupled to the other transistor shown lower in the Figure. The source to body connection is formed integrally as explained in connection with FIGS. 4 and 5. The outputs are taken from the drains. FIG. 10 shows the sense amplifier shown schematically in FIG. 8 implemented again with two SOI FET transistors formed through a common rx opening. Here it will be appreciated that the structure shown in FIG. 10 is the structure shown in FIG. 9 and its mirror image (i.e. the type of structure shown in FIG. 7) plus a conductive bridge 20 disposed outside the rx opening and providing an electrically conducting path between each "L" shaped gate and its mirror image structure.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An SOI field effect transistor, formed through a field oxide opening, comprising in combination:

a source and a drain each doped to form regions of a first polarity in a silicon body layer doped to form a region with a second polarity;

an insulator and a gate disposed above the body portion of said silicon layer between said source region and said drain region;

a body contact region within said field oxide opening contiguous with said source region and not covered by said gate forming a diode junction between said source and said body contact region in order to drain charge from said body.

2. An SOI field effect transistor, formed through a field oxide opening, comprising in combination:

a source and a drain each doped to form regions of a first polarity in a silicon body layer doped to form a region with a second polarity;

an insulator and a gate disposed above the body portion of said silicon layer between said source region and said drain region;

said gate having a first leg extending along the width of the transistor between said source region and said drain region and overlapping at one end of the field oxide opening, but not extending to the opposite end of the field oxide opening, and a second leg extending toward said drain region and overlapping said field oxide opening;

a body contact region within said field oxide opening contiguous with said source region and not covered by said gate forming a diode junction between said source and said body contact region in order to drain charge from said body.

3. An SOI field effect transistor, formed through a field oxide opening as in claim 2 wherein said gate is "L" shaped.

4. An SOI field effect transistor, formed through a field oxide opening as in claim 2 wherein said body contact region is strongly doped to said second polarity.

5. An SOI field effect transistor, formed through a field oxide opening as in claim 3 wherein said body contact region is strongly doped to said second polarity.

6. SOI field effect transistors, formed through a common field oxide opening, comprising in combination:

a first pair of field effect transistors including a first drain region, a second drain region, and a source region each doped to form a region of a first polarity in a silicon body layer doped to form a region with a second polarity;

each of said field effect transistors having a gate structure with a first leg extending along the width of the field effect transistor from one end of the field oxide opening to a location proximate the opposite end of the field oxide opening and having a second leg contiguous with said first leg extending from said location laterally to a side of the field oxide opening wherein said side is substantially parallel to said first leg;

said pair of field effect transistors disposed in said field oxide opening with their respective first legs extending in the same direction as the source region disposed between them and common to both field effect transistors and with their respective second legs contiguous with said first legs extending in opposite directions;

a body contact region at said location doped to form a region of said second polarity, forming a diode junction between said common source and said body contact region in order to drain charge from said body.

7. SOI field effect transistors as in claim 6 further including a second pair of field effect transistors disposed in said field oxide opening, said second pair of field effect transistors being a mirror image of said first pair of field effect transistors.

8. SOI field effect transistors as in claim 6 wherein each of said gate structures is "L" shaped.

9. SOI field effect transistors as in claim 7 wherein each of said gate structures is "L" shaped.

10. SOI field effect transistors as in claim 6 wherein said body contact region is strongly doped.

11. SOI field effect transistors as in claim 8 wherein said body contact region is strongly doped.

12. SOI field effect transistors as in claim 9 wherein said body contact region is strongly doped.

* * * * *